(12) United States Patent
Miller et al.

(10) Patent No.: US 6,556,959 B1
(45) Date of Patent: Apr. 29, 2003

(54) METHOD AND APPARATUS FOR UPDATING A MANUFACTURING MODEL BASED UPON FAULT DATA RELATING TO PROCESSING OF SEMICONDUCTOR WAFERS

(75) Inventors: Michael L. Miller, Cedar Park, TX (US); Qingsu Wang, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/351,716

(22) Filed: Jul. 12, 1999

(51) Int. Cl.[7] .......................... G06F 19/00; G06F 17/10; G06F 17/50; G06G 7/48
(52) U.S. Cl. ............................... 703/2; 703/6; 703/13; 703/1; 703/12; 703/7; 700/108; 700/109; 700/110; 700/121
(58) Field of Search ........................... 703/6, 7, 12, 13, 703/14, 17, 2; 700/105, 109, 108, 110, 96, 121

(56) References Cited

U.S. PATENT DOCUMENTS

| | | | | |
|---|---|---|---|---|
| 3,751,647 A | * | 8/1973 | Maeder et al. | 713/401 |
| 4,796,194 A | * | 1/1989 | Atherton | 364/468.09 |
| 5,442,562 A | * | 8/1995 | Hopkins et al. | 364/468.15 |
| 5,479,340 A | * | 12/1995 | Fox et al. | 364/153 |
| 5,497,381 A | * | 3/1996 | O'Donoghue et al. | 714/745 |
| 5,546,312 A | * | 8/1996 | Mozumder et al. | 364/468.03 |
| 5,621,652 A | * | 4/1997 | Eakin | 364/490 |
| 5,642,296 A | * | 6/1997 | Saxena | 702/84 |
| 5,719,796 A | * | 2/1998 | Chen | 395/500.34 |
| 5,727,128 A | * | 3/1998 | Morrison | 706/45 |
| 5,773,315 A | * | 6/1998 | Jarvis | 438/14 |
| 5,859,964 A | * | 1/1999 | Wang et al. | 395/185.01 |
| 5,886,909 A | * | 3/1999 | Milor et al. | 364/468.17 |
| 5,896,294 A | * | 4/1999 | Chow et al. | 364/468.28 |
| 5,946,212 A | * | 8/1999 | Bermon et al. | 29/832 |
| 6,246,787 B1 | * | 6/2001 | Hennessey et al. | 382/141 |
| 6,249,712 B1 | * | 6/2001 | Bioquaye | 700/31 |
| 6,292,582 B1 | * | 9/2001 | Lin et al. | 382/149 |

* cited by examiner

Primary Examiner—Todd Ingberg
Assistant Examiner—W Thomson
(74) Attorney, Agent, or Firm—Williams, Morgan & Amerson, P.C.

(57) ABSTRACT

The present invention provides a method and apparatus for performing automated development and updating of a manufacturing model for a manufacturing process. An initial manufacturing model is developed. Tolerances of the manufacturing model are expanded using additional production data. The manufacturing model is then re-developed using the expanded tolerances.

32 Claims, 4 Drawing Sheets

METHOD AND APPARATUS FOR UPDATING A MANUFACTURING MODEL BASED UPON FAULT DATA RELATING TO PROCESSING OF SEMICONDUCTOR WAFERS

BACKGROUND OF THE INVENTION

1. Field of the Invention

This invention relates generally to semiconductor products manufacturing, and, more particularly to a method and means for automated manufacturing model building and updating.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

One of the many aspects of semiconductor manufacturing is overlay control. Overlay is one of several important steps in the lithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices the need for reducing misalignment errors increases dramatically.

Generally, photolithography engineers currently analyze the overlay errors a few times a month. The results from the analysis of the overlay errors are used to manually make updates to control or ASM settings. Some of the problems associated with the current methods include the fact that the ASM settings are only updated a few times a month. Furthermore, currently the ASM updates are performed manually. Therefore, manufacturing models 140 are generally created manually and updated manually, which can compromise the accuracy of manufacturing processes.

Generally, a set of processing steps is performed on a lot of wafers on a semiconductor manufacturing tool called a stepper. The stepper communicates with a manufacturing framework or a network of processing modules. The manufacturing framework is connected to an equipment interface. The equipment interface is connected to a machine interface to which the stepper is connected, thereby facilitating communications between the stepper and the manufacturing framework. The machine interface interacts with an automatic process control (APC) system. The APC system initiates a control script, which can be a computer program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. One important method of improving semiconductor manufacturing is by improving the manufacturing models that are used to perform semiconductor manufacturing processes. Currently, production data are generally analyzed manually and manufacturing models are redefined slowly.

The present invention is directed to overcoming, or at least reducing the effects of, one or more of the problems set forth above.

SUMMARY OF THE INVENTION

In one aspect of the present invention, a method is provided for performing automated development and update of a manufacturing model for a manufacturing process. An initial manufacturing model is developed. Tolerances of the manufacturing model are expanded using additional production data. The manufacturing model is re-developed using the expanded tolerances.

In another aspect of the present invention, an apparatus is provided for performing automated development and updating of a manufacturing model for a manufacturing process. The apparatus of the present invention comprises means for developing an initial manufacturing model, means for expanding tolerances of the manufacturing model using additional production data, and means for re-developing the manufacturing model using the expanded tolerances.

BRIEF DESCRIPTION OF THE DRAWINGS

The invention may be understood by reference to the following description taken in conjunction with the accompanying drawings, in which like reference numerals identify like elements, and in which.

Figure 1:
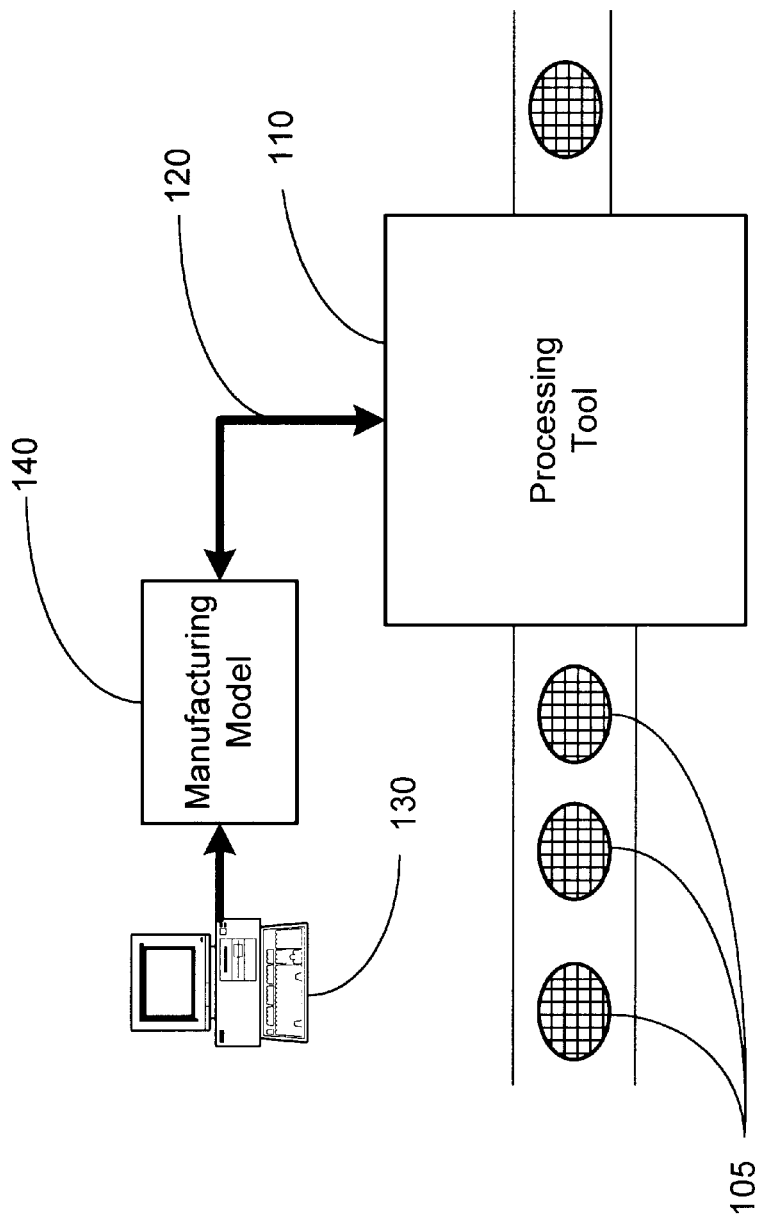
FIG. 1 illustrates semiconductor wafers being processed on a manufacturing tool, using a plurality of control input signals and a manufacturing model.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiments, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. One important process in semiconductor manufacturing is the overlay process. In particular, the overlay process involves measuring misalignment errors between semiconductor layers during manufacturing processes. Improvements in semiconductor manufacturing processes, such as the overlay process, could result in substantial enhancements, in terms of quality and efficiency, in manufacturing semiconductor devices. The present invention provides a method of implementing automated error correction for control of semiconductor processes, such as the overlay process. Furthermore, the present invention provides a method of creating and updating manufacturing models to improve semiconductor manufacturing processes.

Semiconductor devices are processed in a manufacturing environment using a number of input control parameters. Turning now to FIG. 1, in one embodiment, semiconductor products 105, such as semiconductor wafers, are processed on a processing tool 110, such as an exposure tool, using a plurality of control input signals (or control parameters) on a line 120. In one embodiment, the control input signals on the line 120 are sent to the processing tool 110 from a computer system 130. In one embodiment, the control input signals on the line 120 can be integrated into a manufacturing model 140 that controls a manufacturing process. One example of a processing tool 110 used in semiconductor manufacturing processes is a stepper.

In the context of a manufacturing process such as a stepper process, the control inputs on the line 120 that are used to operate the processing tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the features taught by the present invention is a method of updating and creating manufacturing models 140 to control manufacturing processes.

When a process step in the processing tool 110 is concluded, the semiconductor wafer that is being processed in the processing tool 110 is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs of a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, modifications to the control inputs can be used to create and update manufacturing models 140.

Figure 2:
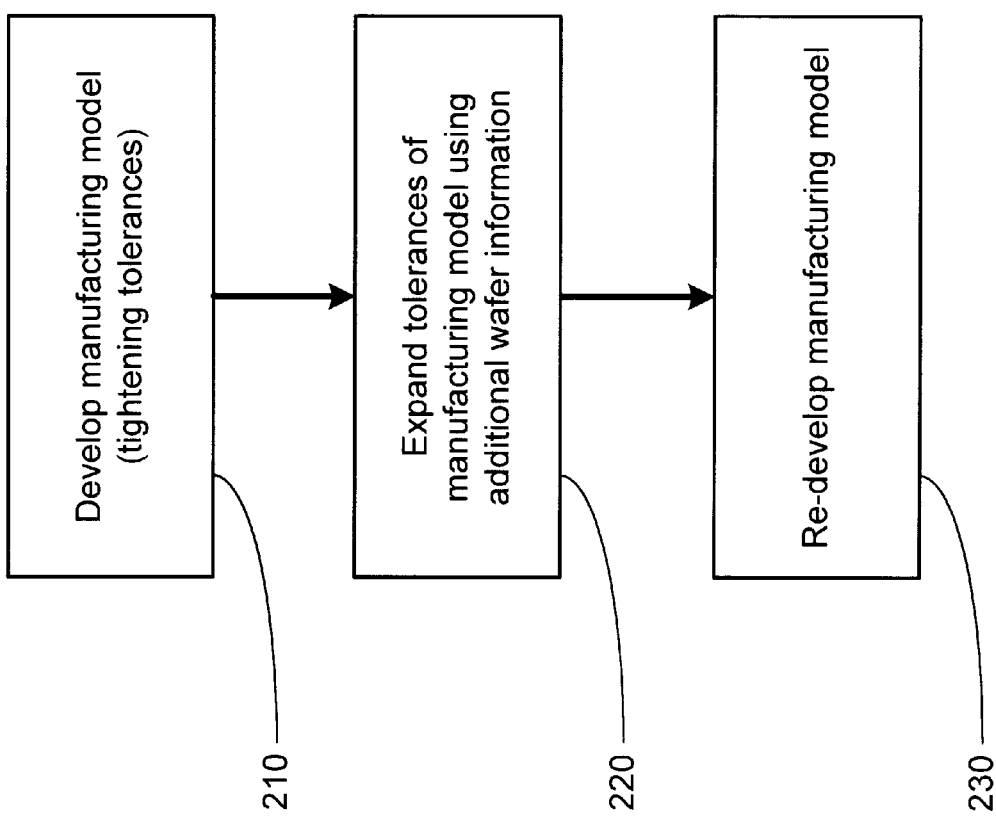
FIG. 2 depicts a flowchart representation of one embodiment of the present invention.

Turning now to FIG. 2, a flowchart representation of one embodiment of the present invention is illustrated. In one embodiment, a manufacturing model 140 is developed, as described in block 210 of FIG. 2. In one embodiment, a manufacturing model 140 defines the procedures for one or more manufacturing processes. A manufacturing model 140 can be used to guide a set of devices being manufactured, such as semiconductor devices, through a number of processes. The manufacturing model 140 can be used to obtain uniformity in manufacturing processes. Manufacturing models 140 contain data regarding which manufacturing tools are to be used for manufacturing processes.

Manufacturing models 140 can also be used to keep track of the effects of parameters on a semiconductor device that are difficult to measure. Generally, employing a manufacturing model 140 for manufacturing processes comprises defining a variety of tolerance levels narrowly. For example, the misregistration in an overlay registration process may be more acceptable than indicated by the first implementation of a particular manufacturing model 140.

Furthermore, the aging of a manufacturing model 140 may cause degradation of output products that are manufactured within a manufacturing model 140 structure. In other words, gradually over time, a manufacturing model 140 can change its prior behavior. One example of aging of a manufacturing model 140 is degradation of lamps in an exposure tool. Implementation of the methods taught by the present invention can reduce the effects of aging of manufacturing models 140.

Figure 3:
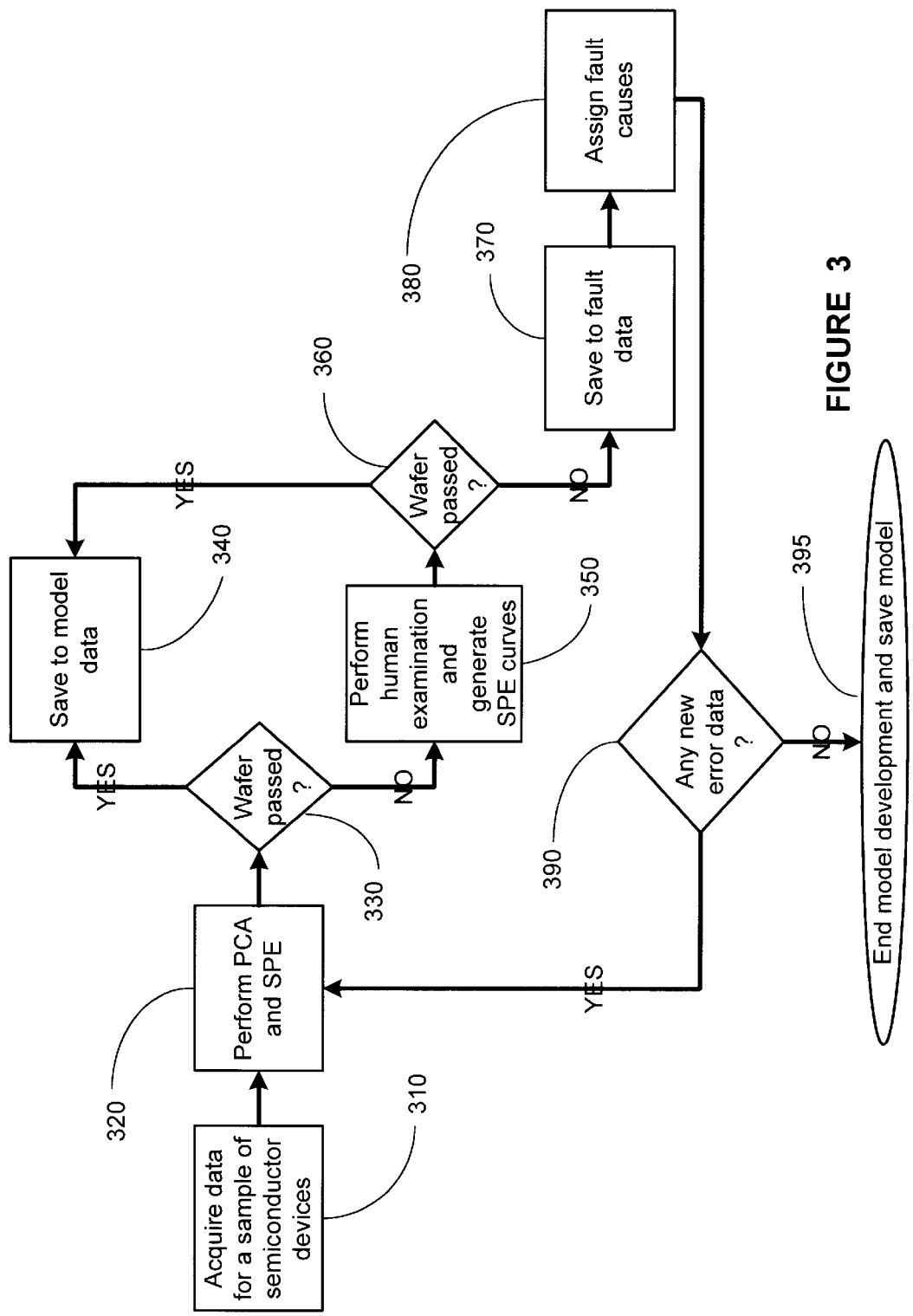
FIG. 3 illustrates one method of developing a manufacturing model, as taught by the present invention.

Turning now to FIG. 3, one method of developing a manufacturing model 140, as taught by the present invention, is illustrated. Once a lot of semiconductor devices, such as semiconductor wafers, are processed data relating to a sample of processed semiconductor devices is acquired, as described in block 310 of FIG. 3. In one embodiment, the sample of processed semiconductor devices is collected by a random selection process, which can be implemented by those skilled in the art having the benefit of the present disclosure.

Once data is collected from the sample semiconductor devices, Principle Component Analysis (PCA) and Square Prediction Error (SPE) functions are performed, as described in block 320 of FIG. 3. In one embodiment, the PCA is performed to extract and define the essence of an acceptable run of semiconductor devices. In other words, the PCA function is used to distill a representation of a run of semiconductor devices that contains an acceptable tolerance level from virtually all of the data collected for a single run of semiconductor devices.

In one embodiment, the Square Prediction Error is a representation of how different the actual process run of semiconductor devices are from the original process model used for initial process steps. The SPE function is a measure of how well a set of data from the process run of semiconductor devices compares to an existing manufacturing model, which provides a threshold for an acceptable number of semiconductor devices that pass one or more quality tests. In other words, the SPE function provides a threshold level for what a normal run of semiconductor devices should produce. In one embodiment, the SPE limit may be 90%. In other words, a lot of semiconductor devices that is sent through a process step and has an SPE limit of 90% would normally contain only approximately 10% of semiconductor devices that are not acceptable.

In one embodiment, once the PICA and the SPE functions are executed, the semiconductor devices under process are examined or inspected for quality. In one embodiment, the examination of the semiconductor devices is performed in an automatic fashion. Upon inspection of each semiconductor device under process, a determination is made whether the semiconductor device under inspection passes a quality inspection, as described in block 330 of FIG. 3. In one embodiment, the aforementioned quality inspection includes comparing the processed semiconductor device with data relating to the manufacturing model 140. When a determination is made that the semiconductor device under inspection passes a quality check, data relating to that particular semiconductor device is saved as manufacturing model data, as described in block 340 of FIG. 3. In one embodiment, data regarding the semiconductor devices that pass a quality inspection, described in block 330, is stored in a separate manufacturing model data subdirectory (not shown).

When a determination is made that the semiconductor device under inspection fails a quality check, a manual examination is performed and the corresponding SPE data is plotted, as described in block 350 of FIG. 3. In one embodiment, performing the manual inspection comprises inspecting the semiconductor device and generating a number of blocks of data (fault data) that describe the differences in characteristics of the semiconductor device under inspection as compared to the characteristics predicted by the manufacturing model 140. In one embodiment, fault data for multiple semiconductor devices is stored in a fault data subdirectory (not shown) for access by a computer program that also controls the manufacturing model 140.

Once manual examination of semiconductor devices is performed and SPE curves of the semiconductor devices are examined, a determination is made whether the semiconductor device under examination is a passable semiconductor device, as described in block 360 of FIG. 3. When a determination is made that the semiconductor device under inspection passes a quality check, data relating to that particular semiconductor device is saved as manufacturing model data, as described in block 340 of FIG. 3. In one embodiment, data regarding semiconductor devices that pass a quality inspection, described in block 360, is stored in the manufacturing model data subdirectory.

When a determination is made that the semiconductor device under inspection fails a quality check, the fault data relating to the semiconductor device is stored in the fault data directory, as described in block 370 of FIG. 3. The cause of the fault is then assigned and associated with the semiconductor device and stored in a file that corresponds to the semiconductor device, as described in block 380 of FIG. 3. In one embodiment, the fault cause can be used to improve the manufacturing model 140. A determination is then made whether any new error data is available for subsequent semiconductor devices, as described in block 390 of FIG. 3. When a determination is made that new error data is available, the steps of Principle Component Analysis (PCA) and Square Prediction Error (SPE) functions are again performed, as described in block 320 of FIG. 3, and the subsequent steps described above are repeated. When a determination is made that no new error data is available, which may indicate that no other semiconductor devices are available, the manufacturing model 140 development is terminated and the model is saved onto a data storage media, as described in block 395 of FIG. 3.

Turning back to FIG. 2, once a manufacturing model 140 has been developed as described in block 210, various tolerance levels associated with the manufacturing model 140 are expanded using additional semiconductor device information, as described in block 220. One purpose of expanding the tolerances of the manufacturing model 140 is to create a more robust manufacturing model 140. Another purpose of expanding the tolerances of the manufacturing model 140 is to confirm the validity of the existing manufacturing model 140. The step of expanding the tolerance levels of the manufacturing model 140, described in block 220, is illustrated in further detail in FIG. 4.

Figure 4:
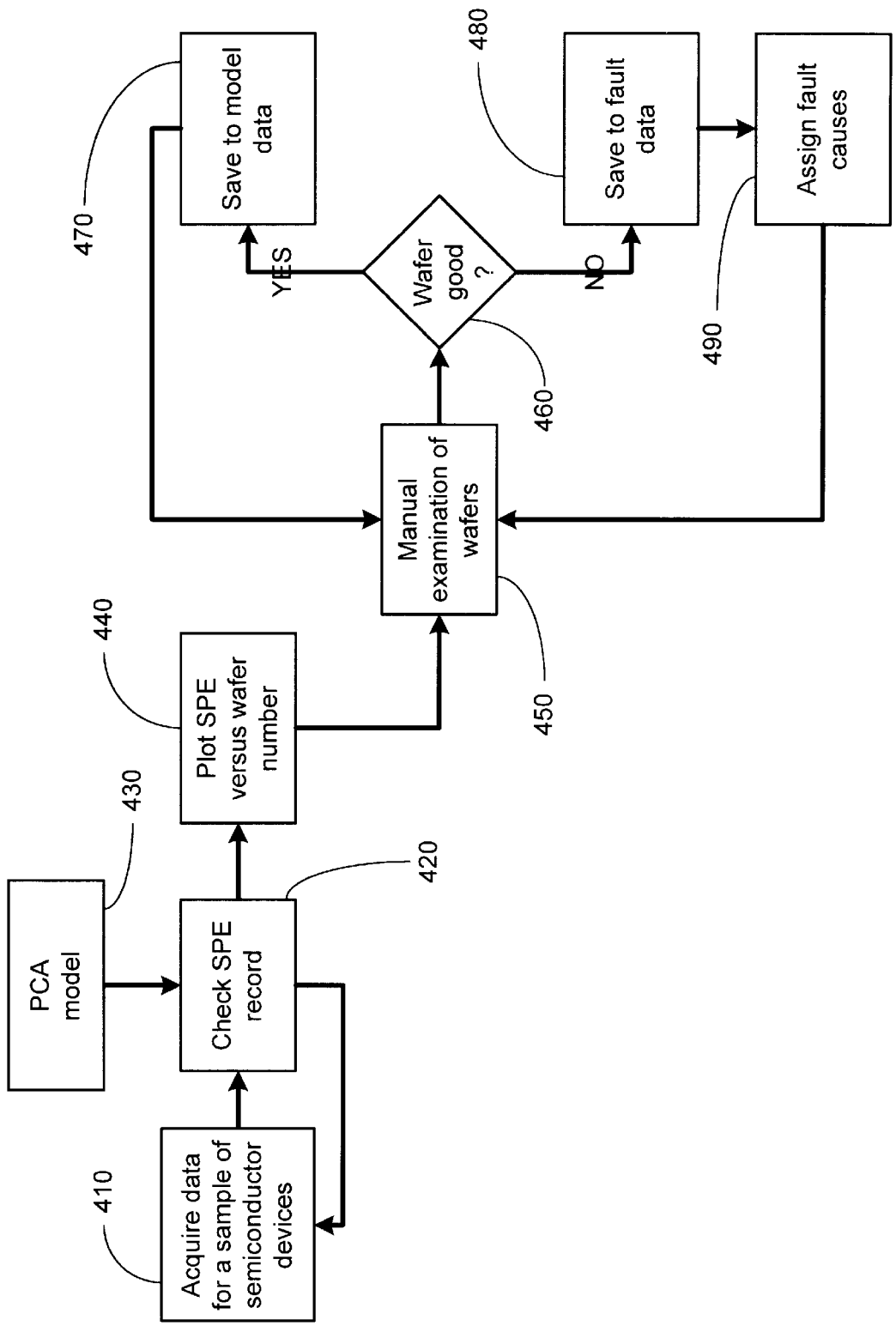
FIG. 4 illustrates one method of expanding the tolerance levels of the manufacturing model, as taught by the present invention.

Turning now to FIG. 4, data corresponding to a sample of semiconductor devices is acquired, as described in block 410. To expand the tolerance levels of the manufacturing model 140, new data that corresponds to additional semiconductor devices is examined. In one embodiment, the examination of additional semiconductor data is performed offline (post-production data access). In on& embodiment, the additional data that is acquired is from other semiconductor process runs, instead of acquiring data from test devices processed using the manufacturing model 140.

Once the data files relating to processed semiconductor devices are acquired, the PCA and SPE records that correspond to a particular PCA manufacturing model are examined, as described in blocks 420 and 430 of FIG. 4. In one embodiment, the SPE data is plotted versus a discrete semiconductor device number, as described in block 440 of FIG. 4. A manual examination is performed on the semiconductor wafer, as described in block 450 of FIG. 4. In one embodiment, performing the manual inspection comprises inspecting the semiconductor device and generating a number of blocks of data (fault data) that describe the differences in characteristics of the semiconductor device under inspection as compared to the characteristics predicted by the manufacturing model 140. In one embodiment, fault data for multiple semiconductor devices is stored in a fault data subdirectory for access by a computer program that also controls the manufacturing model 140.

Once manual examination of semiconductor devices is performed and SPE curves of the semiconductor devices are examined, a determination is made whether the semiconductor device under examination is a passable semiconductor device, as described in block 460 of FIG. 4. When a determination is made that the semiconductor device under inspection passes a quality check, data relating to that particular semiconductor device is saved as manufacturing model data, as described in block 470 of FIG. 4. In one embodiment, data regarding semiconductor devices that pass a quality inspection, described in block 450, is stored in the manufacturing model data subdirectory.

When a determination is made that the semiconductor device under inspection fails a quality check, the fault data relating to the semiconductor device is stored in the fault data directory, as described in block 480 of FIG. 4. The cause of the fault is then assigned and associated with the semiconductor device and stored in a file that corresponds to the semiconductor device, as described in block 490 of FIG. 3. In one embodiment, the fault cause can be used to improve the manufacturing model 140. The process of manual examination is repeated for subsequent data files corresponding to other processed semiconductor devices. Including new data for other semiconductor devices updates the manufacturing model 140 such that tolerance levels associated with the manufacturing model 140 are expanded and capable of allowing a wider range of semiconductor devices. Furthermore, fault cause data is used to make changes to the manufacturing model 140, such as changing control input signals on the line 120, thereby updating the manufacturing model 140.

Turning back to FIG. 2, once the manufacturing model 140 has been updated by having various tolerance levels associated with the manufacturing model 140 expanded using additional semiconductor device information, as described in block 220, the manufacturing model 140 is then re-developed using the new data and tolerance levels associated with the manufacturing model 140, as described in block 230 of FIG. 2. In one embodiment, the manufacturing model 140 is re-developed using the principles described above and in FIG. 3. The result is generally a more robust manufacturing model 140 that is capable of processing a wide variety of semiconductor devices.

In one embodiment, the development, updating, and re-development of the manufacturing model 140 are performed automatically using a computer system that hosts a control system, such as an Automatic Process Control (APC) system. In one embodiment, the manufacturing model 140 employs control threads to control the processing of semiconductor devices. One method of re-developing the manufacturing model 140 involves modifying the control threads associated with the manufacturing model 140 based upon new data that is analyzed during the manufacturing model 140 updating procedure.

One method of using the updated control input signals on the line 120, and thereby updating the manufacturing model 140, is implemented by control threads. The control input signal grouping or threads identify a batch of lots with similar characteristics. Control threads can be implemented by a number of semiconductor process controllers, such as an overlay controller. Control threads are a significant part of the control scheme of a semiconductor manufacturing tool, such as the processing tool 110. Each of the different control threads acts like a separate controller, and is differentiated by various process conditions. For overlay control, the control threads are separated by a combination of different conditions, including the semiconductor manufacturing tool (e g., stepper) currently processing the wafer lot, the semiconductor product, the semiconductor manufacturing operation, and the semiconductor manufacturing tool that processes the semiconductor wafer lot at a previous layer of the semiconductor wafer.

One reason for keeping the control threads separate is that different semiconductor manufacturing process conditions affect the overlay error in different fashions. By isolating each of the unique semiconductor manufacturing process conditions into its own corresponding control thread, the overlay error can become a more accurate portrayal of the conditions in which a subsequent semiconductor wafer lot in the control thread will be processed. Since the error measurement is more relevant, changes to the control input signals based upon the error will be more appropriate. The implementation of the control scheme described by the present invention can lead to a reduction in the processing errors.

The principles taught by the present invention can be implemented in an Advanced Process Control (APC) framework. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller. The control methods are generally defined and performed in these scripts. The development of these scripts can comprise a significant portion of the development of a control system and can be incorporated into the manufacturing model 140. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

developing an initial manufacturing model, processing a semiconductor wafer based upon said manufacturing model;

determining fault data based upon said processing of said semiconductor wafer;

expanding a tolerance level related to said manufacturing model based upon said fault data, said expanding of tolerances comprising checking a principle component analysis and checking a square prediction error analysis record corresponding to said semiconductor device for expanding said tolerance level;

re-developing said initial manufacturing model using said expanded tolerances;

wherein developing said initial model comprises:

acquiring data for at least one semiconductor device;

performing a first inspection upon said semiconductor device based upon said principle component analysis and said square prediction error analysis;

determining whether said semiconductor device passes said first inspection;

storing said semiconductor data into a manufacturing model database based upon a determination that said semiconductor device passes said first inspection;

performing a second inspection on said semiconductor devices based upon a determination that said semiconductor device fails said first inspection;

determining whether said semiconductor device passes said second inspection;

storing said semiconductor data into a manufacturing model database based upon a determination that said semiconductor device passes said manual inspection;

storing said semiconductor data into a fault database based upon a determination that said semiconductor device fails said manual inspection;

assigning a fault cause for said failed semiconductor device; and updating said manufacturing model using said stored semiconductor data and said assigned fault cause.

2. The method described in claim 1, wherein acquiring data for at least one semiconductor device further comprises acquiring data for at least one semiconductor device using a random selection process.

3. The method described in claim 1, wherein performing a first inspection upon said semiconductor device based upon said principle component analysis and said square prediction error analysis further comprises inspecting said semiconductor device using automated methods.

4. The method described in claim 1, wherein performing manual inspection on said semiconductor device further comprises examining a square prediction error curve that corresponds to said semiconductor device being inspected.

5. The method described in claim 1, wherein updating said manufacturing model further comprises accessing said semiconductor data from said manufacturing model database and modifying said manufacturing model based upon said semiconductor data.

6. The method described in claim 1, wherein updating said manufacturing model further comprises accessing said semiconductor data from said fault database and modifying a set of control parameters within said manufacturing model.

7. The method described in claim 1, wherein updating said manufacturing model further comprises accessing said assigned fault cause and modifying a set of control parameters within said manufacturing model.

8. The method described in claim 1, wherein expanding tolerances of said manufacturing model using additional production data further comprises:

acquiring data for at least one semiconductor device;

checking a principle component analysis corresponding to said semiconductor device;

checking a square prediction error analysis record corresponding to said semiconductor device;

plotting said square prediction error data versus an identification number corresponding to said semiconductor device based upon said checking of said principle component analysis and said square prediction error analysis;

performing a manual inspection on said semiconductor device based upon said plot of said square prediction error data;

determining whether said semiconductor device passes said manual inspection;

storing said semiconductor data into a manufacturing model database based upon a determination that said semiconductor device passes said manual inspection;

storing said semiconductor data into a fault database based upon a determination that said semiconductor device fails said manual inspection;

assigning a fault cause for said failed semiconductor device; and updating said manufacturing model using said stored semiconductor data and said assigned fault cause.

9. The method described in claim 8, wherein acquiring data for at least one semiconductor device further comprises acquiring data for at least one semiconductor device using a random selection process.

10. The method described in claim 8, wherein updating said manufacturing model further comprises accessing said semiconductor data from said manufacturing model database and modifying said manufacturing model based upon said semiconductor data.

11. The method described in claim 8, wherein updating said manufacturing model further comprises accessing said semiconductor data from said fault database and modifying a set of control parameters within said manufacturing model.

12. The method described in claim 8, wherein updating said manufacturing model further comprises accessing said assigned fault cause and modifying a set of control parameters within said manufacturing model.

13. The method described in claim 1, wherein developing an initial manufacturing model further comprises developing an initial manufacturing model based upon a set of control parameters.

14. The method described in claim 13, wherein developing an initial manufacturing model based upon a set of control parameters further comprises developing an initial manufacturing model based upon control settings defined by a control thread.

15. The method described in claim 13, wherein processing said lot of semiconductor devices based upon said sets of control input parameters further comprises processing semiconductor tools based upon control input parameters that comprise an x-translation signal, a y-translation signal, an x-expansion wafer scale signal, a y-expansion wafer scale signal, a reticle magnification signal, and a reticle rotation signal.

16. The method described in claim 1, wherein developing an initial manufacturing model further comprises developing said initial manufacturing model within an advanced process control framework.

17. A computer readable program storage device encoded with instructions that, when executed by a computer, performs a method, comprising:

developing an initial manufacturing model, processing a semiconductor wafer based upon said manufacturing model;

determining fault data based upon said processing of said semiconductor wafer;

expanding a tolerance level related to said manufacturing model based upon said fault data, said expanding of tolerances comprising checking a principle component analysis and checking a square prediction error analysis record corresponding to said semiconductor device for expanding said tolerance level;

re-developing said initial manufacturing model using said expanded tolerances;

wherein developing said initial model comprises:

acquiring data for at least one semiconductor device;

performing a first inspection upon said semiconductor device based upon said principle component analysis and said square prediction error analysis;

determining whether said semiconductor device passes said first inspection;

storing said semiconductor data into a manufacturing model database based upon a determination that said semiconductor device passes said first inspection;

performing a second inspection on said semiconductor devices based upon a determination that said semiconductor device fails said first inspection;

determining whether said semiconductor device passes said second inspection;

storing said semiconductor data into a manufacturing model database based upon a determination That said semiconductor device passes said manual inspection;

storing said semiconductor data into a fault database based upon a determination that said semiconductor device fails said manual inspection;

assigning a fault cause for said failed semiconductor device; and updating said manufacturing model using said stored semiconductor data and said assigned fault cause.

18. The computer readable program storage device encoded with instructions that, when executed by a computer, performs the method described in claim 17, wherein acquiring data for at least one semiconductor device further comprises acquiring data for at least one semiconductor device using a random selection process.

19. The computer readable program storage device encoded with instructions that, when executed by a computer, performs the method described in claim 17, wherein performing a first inspection upon said semiconductor device based upon said principle component analysis and said square prediction error analysis further comprises inspecting said semiconductor device using automated methods.

20. The computer readable program storage device encoded with instructions that, when executed by a computer, performs the method described in claim 17, wherein performing manual inspection on said semiconductor device further comprises examining a square prediction error curve that corresponds to said semiconductor device being inspected.

21. The computer readable program storage device encoded with instructions that, when executed by a computer, performs the method described in claim 17, wherein updating said manufacturing model further comprises accessing said semiconductor data from said manufacturing model database and modifying said manufacturing model based upon said semiconductor data.

22. The computer readable program storage device encoded with instructions that, when executed by a computer, performs the method described in claim 17, wherein updating said manufacturing model further comprises accessing said semiconductor data from said fault database and modifying a set of control parameters within said manufacturing model.

23. The computer readable program storage device encoded with instructions that, when executed by a computer, performs the method described in claim 17, wherein updating said manufacturing model further comprises accessing said assigned fault cause and modifying a set of control parameters within said manufacturing model.

24. The computer readable program storage device encoded with instructions that, when executed by a computer, performs the method described in claim 17, wherein expanding tolerances of said manufacturing model using additional production data further comprises:
   acquiring data for at least one semiconductor device;
   checking a principle component analysis corresponding to said semiconductor device;
   checking a square prediction error analysis record corresponding to said semiconductor device;
   plotting said square prediction error data versus an identification number corresponding to said semiconductor device based upon said checking of said principle component analysis and said square prediction error analysis;
   performing a manual inspection on said semiconductor device based upon said plot of said square prediction error data;
   determining whether said semiconductor device passes said manual inspection;
   storing said semiconductor data into a manufacturing model database based upon a determination that said semiconductor device passes said manual inspection;
   storing said semiconductor data into a fault database based upon a determination that said semiconductor device fails said manual inspection;
   assigning a fault cause for said failed semiconductor device; and
   updating said manufacturing model using said stored semiconductor data and said assigned fault cause.

25. The computer readable program storage device encoded with instructions that, when executed by a computer, performs the method described in claim 24, wherein acquiring data for at least one semiconductor device further comprises acquiring data for at least one semiconductor device using a random selection process.

26. The computer readable program storage device encoded with instructions that, when executed by a computer, performs the method described in claim 24, wherein updating said manufacturing model further comprises accessing said semiconductor data from said manufacturing model database and modifying said manufacturing model based upon said semiconductor data.

27. The computer readable program storage device encoded with instructions that, when executed by a computer, performs the method described in claim 24, wherein updating said manufacturing model further comprises accessing said semiconductor data from said fault database and modifying a set of control parameters within said manufacturing model.

28. The computer readable program storage device encoded with instructions that, when executed by a computer, performs the method described in claim 24, wherein updating said manufacturing model further comprises accessing said assigned fault cause and modifying a set of control parameters within said manufacturing model.

29. The computer readable program storage device encoded with instructions that, when executed by a computer, performs the method described in claim 17, wherein developing an initial manufacturing model further comprises developing an initial manufacturing model based upon a set of control parameters.

30. The computer readable program storage device encoded with instructions that, when executed by a computer, performs the method described in claim 29, wherein developing an initial manufacturing model based upon a set of control parameters further comprises developing an initial manufacturing model based upon control settings defined by a control thread.

31. The computer readable program storage device encoded with instructions that, when executed by a computer, performs the method described in claim 29, wherein processing said lot of semiconductor devices based upon said sets of control input parameters further comprises processing semiconductor tools based upon control input parameters that comprise an x-translation signal, a y-translation signal, an x-expansion wafer scale signal, a y-expansion wafer scale signal, a reticle magnification signal, and a reticle rotation signal.

32. The computer readable program storage device encoded with instructions that, when executed by a computer, performs the method described in claim 17, wherein developing an initial manufacturing model further comprises developing said initial manufacturing model within an advanced process control framework.

* * * * *

UNITED STATES PATENT AND TRADEMARK OFFICE
CERTIFICATE OF CORRECTION

PATENT NO. : 6,556,959 B1 Page 1 of 1
DATED : April 29, 2003
INVENTOR(S) : Michael L. Miller and Qingsu Wang It is certified that error appears in the above-identified patent and that said Letters Patent is hereby corrected as shown below:

Column 1,
Line 11, insert a comma between "particularly" and "to."
Line 44, insert a comma between "devices" and "the."

Column 3,
Line 1, replace "developers" with -- developers' --.

Column 4,
Line 33, insert a comma between "processed" and "data."
Line 65, replace "PICA" with -- PCA --.

Column 6,
Line 13, replace "on&" with -- one --.

Signed and Sealed this

Fifteenth Day of July, 2003

JAMES E. ROGAN
*Director of the United States Patent and Trademark Office*